United States Patent
Hwang et al.

(10) Patent No.: US 10,032,710 B2
(45) Date of Patent: Jul. 24, 2018

(54) VIA PATTERN TO REDUCE CROSSTALK BETWEEN DIFFERENTIAL SIGNAL PAIRS

(71) Applicant: NVIDIA CORPORATION, Santa Clara, CA (US)

(72) Inventors: Seunghyun Hwang, San Jose, CA (US); Vishnu Balan, Saratoga, CA (US); Sunil Rao Sudhakaran, San Francisco, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 14/807,823

(22) Filed: Jul. 23, 2015

(65) Prior Publication Data
US 2017/0025345 A1    Jan. 26, 2017

(51) Int. Cl.
| H01L 23/498 | (2006.01) |
| H01L 23/52 | (2006.01) |
| H05K 1/02 | (2006.01) |
| H05K 1/11 | (2006.01) |
| H01L 23/50 | (2006.01) |

(Continued)

(52) U.S. Cl.
CPC .......... *H01L 23/50* (2013.01); *H01L 21/486* (2013.01); *H01L 23/485* (2013.01); *H01L 23/49816* (2013.01); *H01L 23/49827* (2013.01); *H01L 23/49838* (2013.01); *H01L 23/5226* (2013.01); *H01L 24/17* (2013.01); *H01L 24/49* (2013.01); *H05K 1/0298* (2013.01); *H05K 1/114* (2013.01)

(58) Field of Classification Search
CPC ............... H05K 1/0298; H05K 1/114; H01L 23/49816; H01L 23/49827; H01L 23/49838; H01L 23/485; H01L 23/50; H01L 23/5226; H01L 21/486; H01L 24/17; H01L 24/49

USPC ....... 257/737, 738, 784, 690, 692, 531, 532, 257/E23.067, E23.068, E23.069, E23.07, 257/E23.021, E21.499, E21.503; 438/106, 108, 381, 612, 613; 174/260, 174/261; 335/5

See application file for complete search history.

(56) References Cited

U.S. PATENT DOCUMENTS 6,479,319 B1 *  11/2002  Mora ................. H01L 23/49838
                                                    257/E23.07
6,486,405 B2 *  11/2002  Lin ....................... H01B 11/005
                                                    174/113 R (Continued)

*Primary Examiner* — Dao H Nguyen
(74) *Attorney, Agent, or Firm* — Artegis Law Group, LLP

(57) ABSTRACT

An integrated circuit (IC) system includes an IC coupled to a package. The package, in turn, is coupled to a ball grid array. The integrated circuit is electrically coupled to the ball grid array by a plurality of package through-hole (PTH) vias that penetrate through the package. Each PTH via includes a conductive element associated with a differential signaling pair. The conductive elements within a given differential signaling pair are disposed in the package at specific locations, relative to other conductive elements in other differential signaling pairs, to reduce crosstalk between those differential signaling pairs. At least one advantage of technique described herein is that the conductive elements within the package can be densely packed together without inducing excessive crosstalk. Therefore, the package can support a large number of differential signaling pairs, allowing high-throughput data communication.

22 Claims, 9 Drawing Sheets

(51) Int. Cl.
*H01L 21/48* (2006.01)
*H01L 23/522* (2006.01)
*H01L 23/00* (2006.01)
*H01L 23/485* (2006.01)

(56) References Cited

U.S. PATENT DOCUMENTS

| | | | | |
|---|---|---|---|---|
| 8,062,968 | B1* | 11/2011 | Conn | H01L 23/055 |
| | | | | 257/779 |
| 9,089,060 | B1* | 7/2015 | Azeroual | H05K 1/114 |
| 9,269,659 | B1* | 2/2016 | Foong | H01L 23/15 |
| 9,543,243 | B2* | 1/2017 | Masleid | H01L 24/17 |
| 2005/0099240 | A1* | 5/2005 | Lin | H01P 3/02 |
| | | | | 333/5 |
| 2006/0065965 | A1* | 3/2006 | Ohsaka | H01L 23/49838 |
| | | | | 257/690 |
| 2012/0001327 | A1* | 1/2012 | Zhou | H01L 23/50 |
| | | | | 257/738 |
| 2013/0087918 | A1* | 4/2013 | Weekly | H01L 23/50 |
| | | | | 257/738 |
| 2013/0093084 | A1* | 4/2013 | Chen | H01L 21/563 |
| | | | | 257/738 |
| 2015/0001716 | A1* | 1/2015 | Chan | H01L 23/49816 |
| | | | | 257/738 |
| 2015/0048480 | A1* | 2/2015 | Kim | H01L 21/76885 |
| | | | | 257/531 |

* cited by examiner

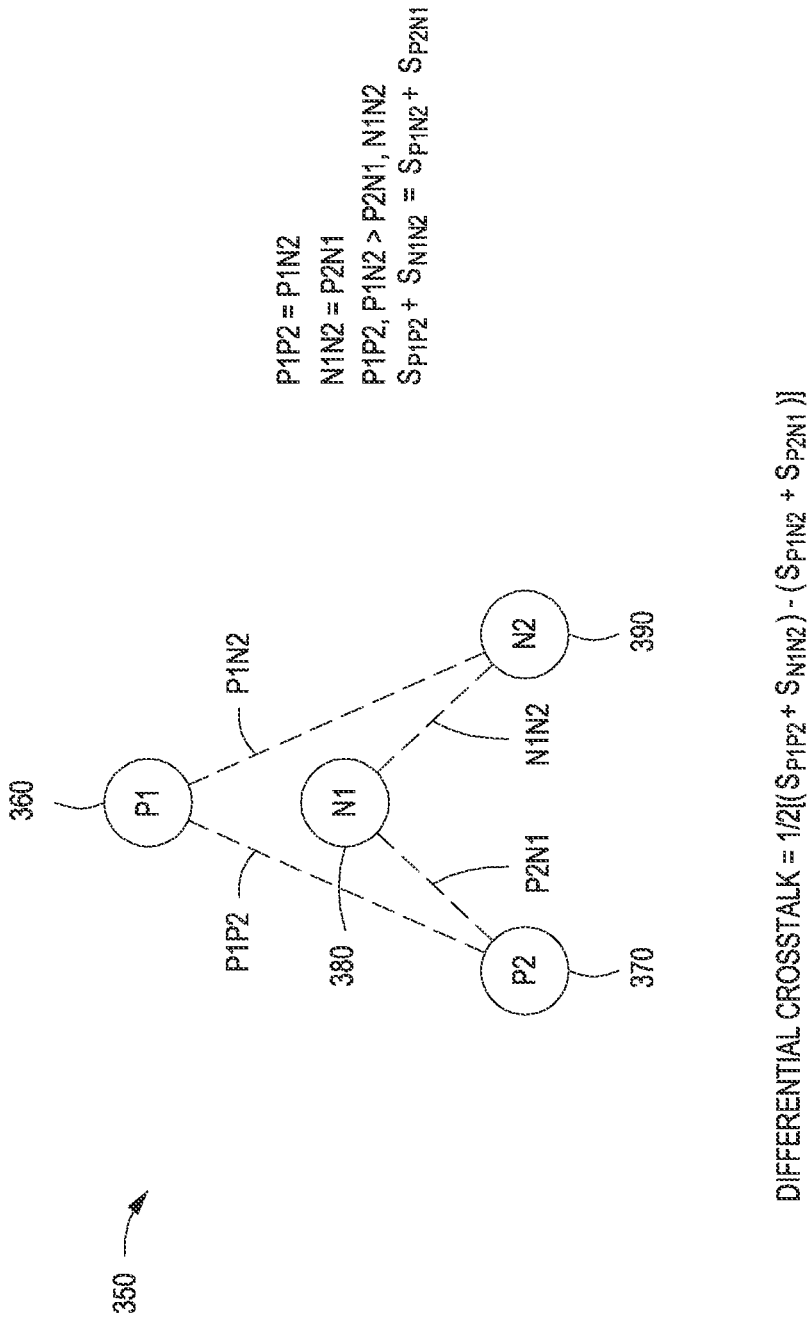

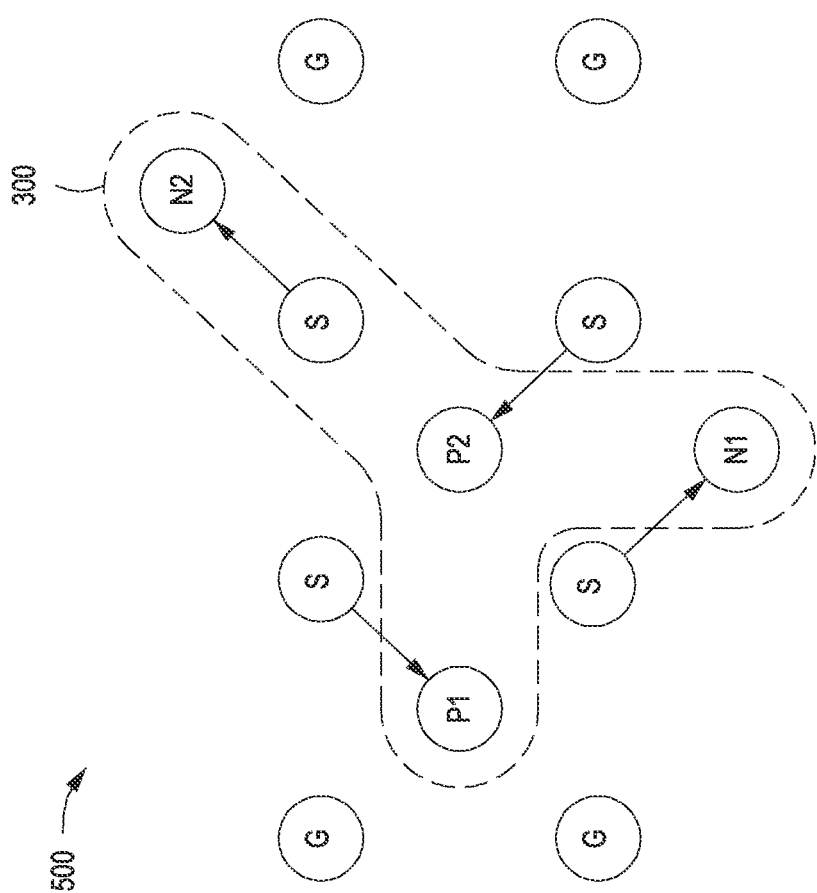

US 10,032,710 B2

VIA PATTERN TO REDUCE CROSSTALK BETWEEN DIFFERENTIAL SIGNAL PAIRS

BACKGROUND OF THE INVENTION

Field of the Invention

Embodiments of the present invention relate generally to integrated circuits and, more specifically, to a via pattern to reduce crosstalk between differential signal pairs.

Description of the Related Art

A conventional data connector, such as a peripheral component interconnect express (PCIe) interconnect, couples together different portions of computing devices to allow those portions to communicate with one another. For example, a central processing unit (CPU) within a computing device could be coupled to a graphics processing unit (GPU) within the computing device via a PCIe interconnect. Conventional data connectors typically implement differential signaling techniques, whereby pairs of wires transport complementary signals.

One difficulty with implementing differential signaling, especially in more complex data connectors, is that the different pairs of wires within the connector may induce crosstalk with one another. Crosstalk is undesirable in data connectors because excessive crosstalk can degrade the differential signals and decrease performance. Specifically, crosstalk can increase signal noise, which, in turn, limits data rates. One technique for reducing crosstalk involves spacing differential signal pairs sufficiently far apart to ensure that noise introduced by crosstalk is reduced to acceptable levels. However, with high-throughput data connectors, the space required to ensure acceptable noise levels would result in a data connector size that is too large and difficult or infeasible to manufacture.

As the foregoing illustrates, what is needed in the art is a more effective way to reduce crosstalk in differential signal pairs.

SUMMARY OF THE INVENTION

One embodiment of the present invention sets forth an integrated circuit layer, including a first conductive element included within a first via, a second conductive element included within a second via, where the first via resides at a first distance from the second via, a third conductive element included within a third via, wherein the third via resides at a second distance from the second via, and the first distance and second distance are substantially equal, and a fourth conductive element included within a fourth via, wherein the fourth via resides at a third distance from the first via and at a fourth distance from the third via, and wherein the third distance and the fourth distance are substantially equal.

At least one advantage of technique described herein is that the conductive elements within the package can be densely packed together without inducing excessive crosstalk. Therefore, the package can support a large number of differential signaling pairs, allowing high-throughput data communication.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3A-3B are conceptual diagrams illustrating exemplary PTH via patterns for reducing crosstalk within the IC system of FIG. 1, according to one embodiment of the present invention;

FIGS. 5A-5B are conceptual diagrams illustrating the PTH via patterns shown in FIGS. 3A-3B, respectively, implemented with a conventional ball grid array, according to one embodiment of the present invention.

DETAILED DESCRIPTION

In the following description, numerous specific details are set forth to provide a more thorough understanding of the present invention. However, it will be apparent to one of skill in the art that the present invention may be practiced without one or more of these specific details.

Figure 1:
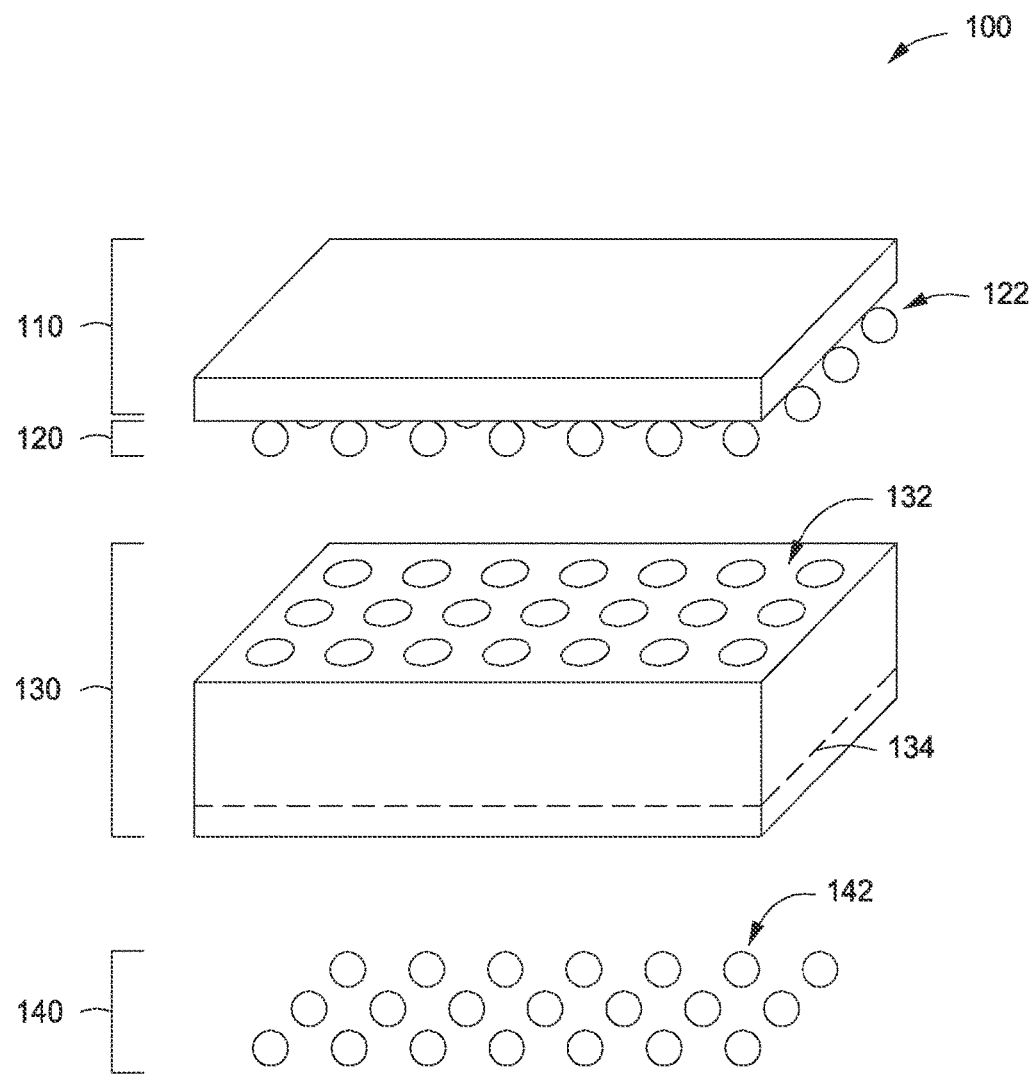
FIG. 1 is a block diagram illustrating an integrated circuit (IC) system, according to one embodiment of the present invention.

FIG. 1 is a block diagram illustrating an integrated circuit (IC) system, according to one embodiment of the present invention. As shown, IC system 100 includes, without limitation, an IC 110, a bump layer 120, a package 130, and a ball grid array (BGA) 140. Bump layer 120 includes a plurality of solder bumps 122. Package 130 includes a plurality of PTH vias 132 and, in certain embodiments, a redistribution layer 134. BGA 140 includes a plurality of balls 142.

IC 110 may be electrically coupled to package 130 by solder bumps 122. Each PTH via 132 includes electrically conductive elements configured to transport signals to and from IC 110, by way of solder bumps 122. The conductive elements within package 130 may also be electrically coupled to balls 142 within BGA 140. BGA 140 may be electrically coupled to other circuit elements, computer chips, peripheral devices, and other types of components (none shown). With this configuration, IC 110 may transmit signals to, and receive signals from, the other components coupled to BGA 140, by way of conductive elements within package 130 and BGA 140.

Each conductive element within a given PTH via 132 may be associated with a complementary conductive element within a corresponding PTH via 132. Two such conductive elements may form a differential signal pair. Package 130 may include any number of different pairs of PTH vias 132 and corresponding pairs of conductive elements. In this fashion, package 130 may implement a portion of a data connector. The data connector implemented within package 130 may be designed in accordance with any technically feasible communication protocol, including, for example, a PCIe protocol, among others. Thus, package 130 may comprise a portion of a PCIe interconnect, in some embodiments.

Figure 2:
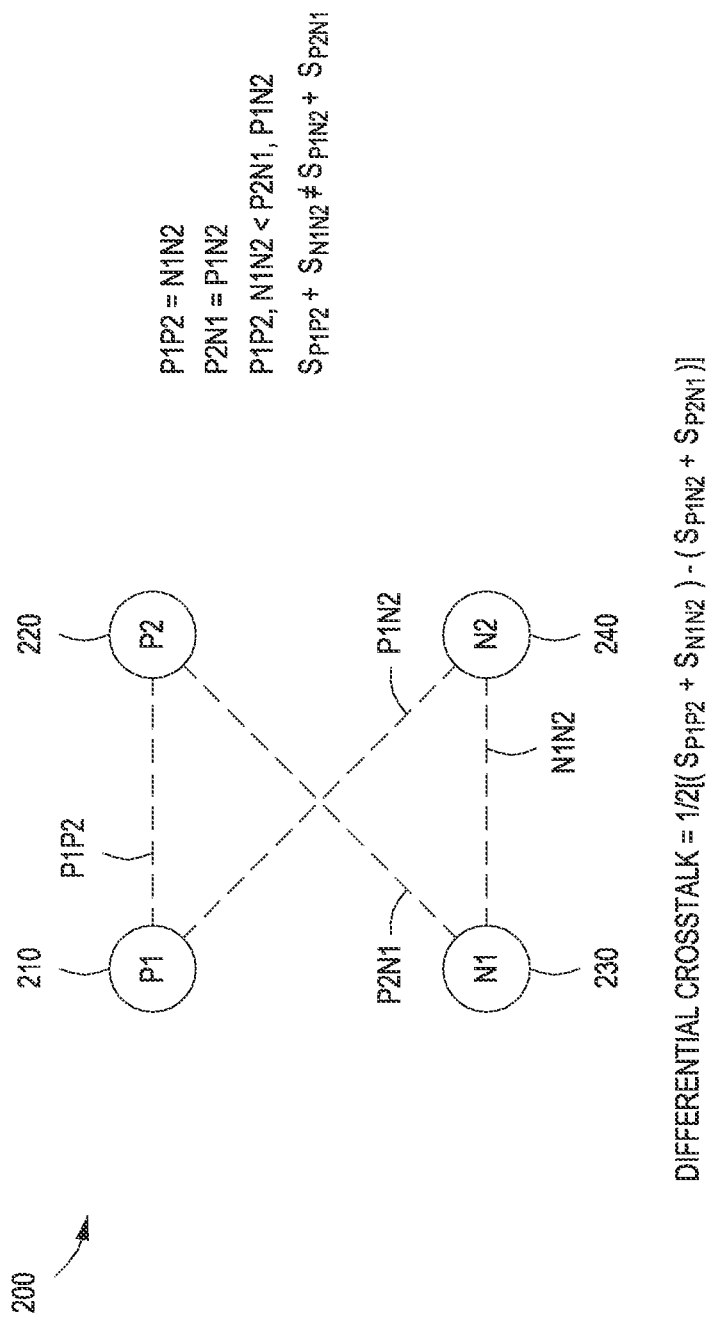
FIG. 2 is a conceptual diagram illustrating an exemplary package through-hole (PTH) via pattern that may be implemented in the IC system of FIG. 1.

The various pairs of PTH vias 132 disposed within package 130 may be arranged according to a wide variety of different placement patterns. Certain patterns may reduce crosstalk between one differential signal pair and other differential signal pairs. FIGS. 2-3B illustrate exemplary placement patterns that may be implemented to fabricate PTH vias 132 within package 130.

In one embodiment, balls 142 within BGA 140 may be arranged according to the placement patterns mentioned above and described below in conjunction with FIGS. 2-3B. With this configuration, each of balls 142 may be substantially aligned with a different PTH via and corresponding conductive element within package 130. An advantage of this approach may be realized in fabrication environments where the placement of balls 142 within BGA 140 drives the placement of PTH vias 132. In such environments, positioning balls 142 according to one of the disclosed placement patterns naturally constrains the fabrication of PTH vias 132 to the same placement pattern. Thus, by implementing one of the disclosed placement patterns within BGA 140, crosstalk may be reduced.

Figure 5B:
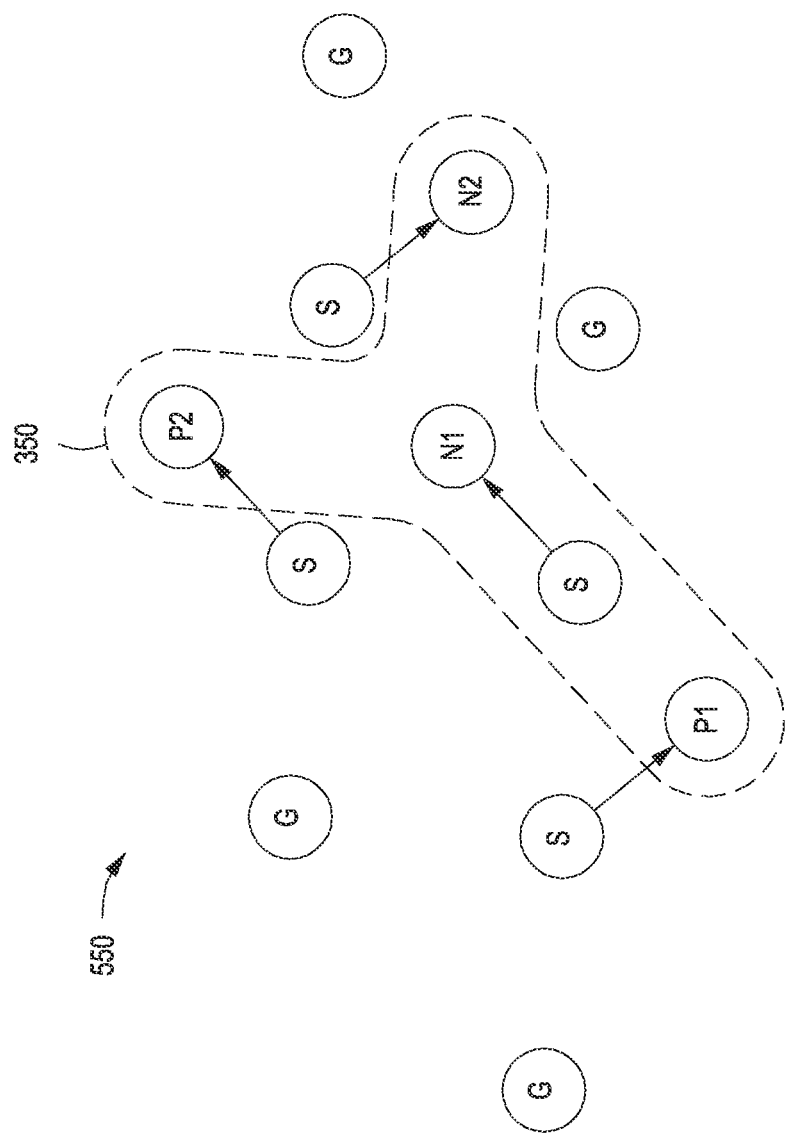

In another embodiment, balls 142 within BGA 140 may be arranged according to a conventional grid-type placement pattern, and may not be substantially aligned with the conductive elements within package 130. Nonetheless, PTH vias 132 may still be placed according to the placement patterns discussed herein. In particular, package 130 may include redistribution layer 134, shown in FIG. 1, that includes conductive leads configured to couple each ball 142 of BGA 140 to each conductive element within package 140. In this fashion, redistribution layer 134 acts as a conductive interface between PTH vias 132 and balls 142 in situations where those elements are arranged according to different placement patterns. Redistribution layer 134 may be included in package 130, in the fashion shown, or may constitute a separate layer of integrated circuit system 100. An advantage of the approach described herein is that PTH vias 132 may be placed according to patterns that reduce crosstalk, without requiring balls 142 of BGA 140 to be similarly placed. FIGS. 5A-5B set forth exemplary techniques for redistributing signal pathways from balls 142, arranged according to a conventional placement pattern, to conductive elements within PTH vias 132, arranged according to the placement patterns discussed in conjunction with FIGS. 3A-3B.

FIG. 2 is a conceptual diagram illustrating an exemplary PTH via pattern that may be implemented in the IC system of FIG. 1. As shown, PTH via pattern 200 includes a set of four PTH vias 210, 220, 230, and 240, configured to include conductive elements. PTH via 210 includes a conductive element labeled P1, PTH via 220 includes a conductive element labeled P2, PTH via 230 includes a conductive element labeled N1, and PTH via 240 includes a conductive element labeled N2. P1 and N1 form a differential signal pair, while P2 and N2 form another differential signal pair.

P1 and N1, and P2 and N2, may induce crosstalk with one another. The amount of crosstalk induced may be derived from various distances between P1, N1, P2, and N2. As is shown, P1 and P2 are positioned a distance P1P2 apart. N1 and N2 are positioned a distance N1N2 apart. Distances P1N1 and N1N2 are approximately equal. N1 and P2 are positioned a distance N1P2 apart. P1 and N2 are positioned a distance P1N2 apart. Distances N1P2 and P1N2 are approximately equal. Also, distances P1P2 and N1N2 are not equal to distances N1P2 and P1N2, due to the placement of PTH vias 210, 220, 230, and 240. Based on these distances, the amount of differential crosstalk induced between P1 and N1, and P2 and N2, is given by equation 1:

$$\text{Differential Crosstalk} = \tfrac{1}{2}[(S_{P1P2} + S_{N1N2}) - (S_{P1N2} + S_{P2N1})] \qquad \text{equation (1)}$$

In equation 1, $S_{P1P2}$ reflects an amount of interference that depends on distance P1P2, $S_{N1N2}$ reflects an amount of interference that depends on distance N1N2, $S_{P1N2}$ reflects an amount of interference that depends on distance P1N2, and $S_{P2N1}$ is an amount of interference that depends on distance P2N1. Thus, $S_{P1P2}$ and $S_{N1N2}$ are equal, and $S_{P1N2}$ and $S_{P2N1}$ are also equal. However, since P1P2 and N1N2 are not equal to distances P1N2 and P2N1, $(S_{P1P2} + S_{N1N2})$ is not equal to $(S_{P1N2} + S_{P2N1})$, and so the differential crosstalk associated with pattern 200 has a non-zero value.

Consequently, arranging PTH vias 132 within package 130 according to pattern 200 may limit the data rate with which data can be communicated across package 130. However, FIGS. 3A-3B set forth alternative patterns for arranging PTH vias 132, which may reduce crosstalk, and, therefore, facilitate a higher data rate.

Figure 3A:
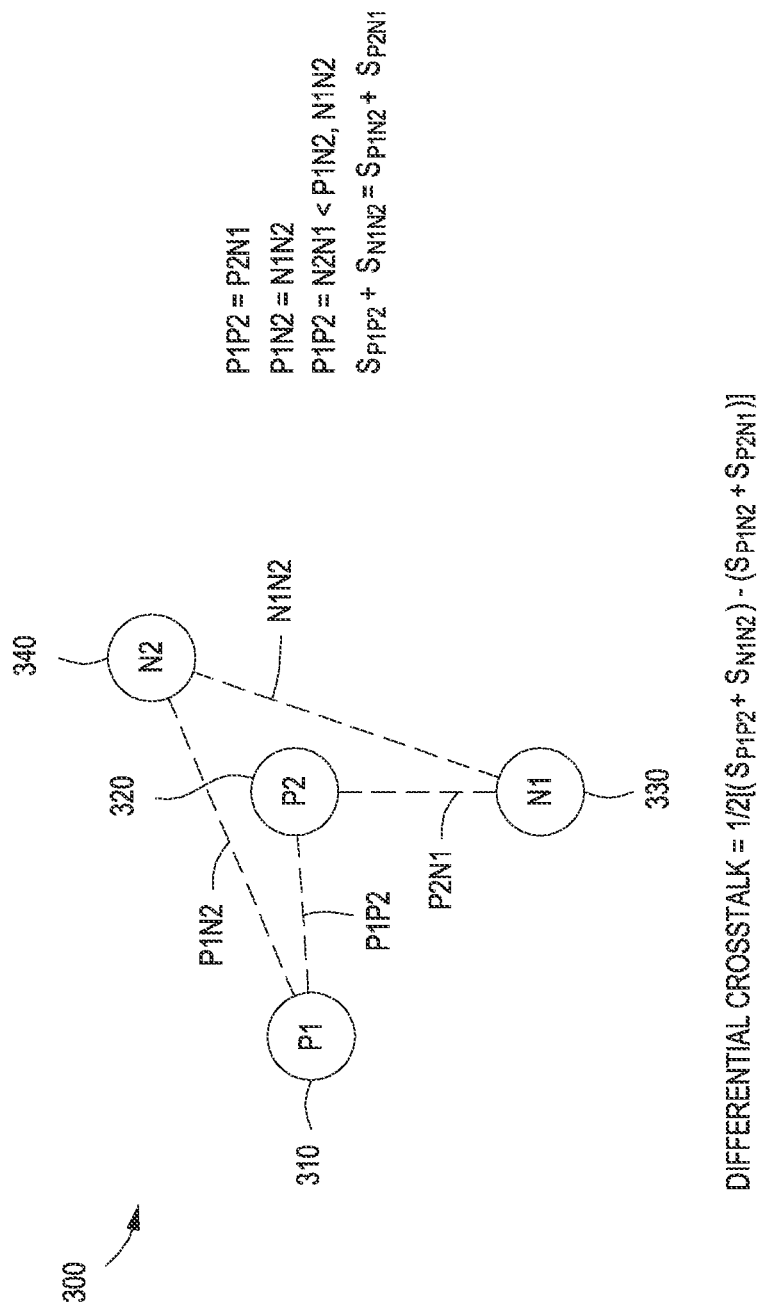

FIGS. 3A-3B are conceptual diagrams illustrating exemplary substrate via patterns for reducing crosstalk within the IC system of FIG. 1, according to one embodiment of the present invention.

As shown in FIG. 3A, PTH via pattern 300 includes a set of four PTH vias 310, 320, 330, and 340, configured to include conductive elements P1, P2, N1, and N2, respectively. As with FIG. 2, P1 and N1 form a differential signal pair, while P2 and N2 form another differential signal pair.

Unlike PTH via pattern 300, PTH vias 310, 320, 330, and 340 are arranged such that distances P1P2 and P2N1 are equal, and distances P1N2 and N1N2 are equal. Thus, with reference to equation 1, $S_{P1P2}$ and $S_{P2N1}$ are substantially equal, and $S_{P1N2}$ and $S_{N1N2}$ are also substantially equal. $(S_{P1P2} + S_{N1N2})$ is therefore substantially equal to $(S_{P1N2} + S_{P2N1})$, and so those terms substantially cancel one another in equation 1. Accordingly, when PTH vias 132 are placed according to PTH via pattern 300, crosstalk between sets of differential signal pairs may be reduced, allowing a higher data rate to be achieved. FIG. 3B illustrate an alternative PTH via pattern for reducing crosstalk.

As shown in FIG. 3B, PTH via pattern 350 includes a set of four PTH vias 360, 370, 380, and 390, configured to include conductive elements P1, P2, N1, and N2, respectively. As with FIG. 2, P1 and N1 form a differential signal pair, while P2 and N2 form another differential signal pair.

Unlike PTH via pattern 300, PTH vias 360, 370, 380, and 390 are arranged such that distances P1P2 and P1N2 are equal, and distances N1N2 and P2N1 are equal. Thus, with reference to equation 1, $S_{P1P2}$ and $S_{P1N2}$ are substantially equal, and $S_{N1N2}$ and $S_{P2N1}$ are also substantially equal. $(S_{P1P2} + S_{N1N2})$ is therefore substantially equal to $(S_{P1N2} + S_{P2N1})$, and so those terms substantially cancel one another in equation 1. Accordingly, when PTH vias 132 are placed according to PTH via pattern 350, crosstalk between sets of differential signal pairs may be reduced, allowing a higher data rate to be achieved.

Figure 4A:
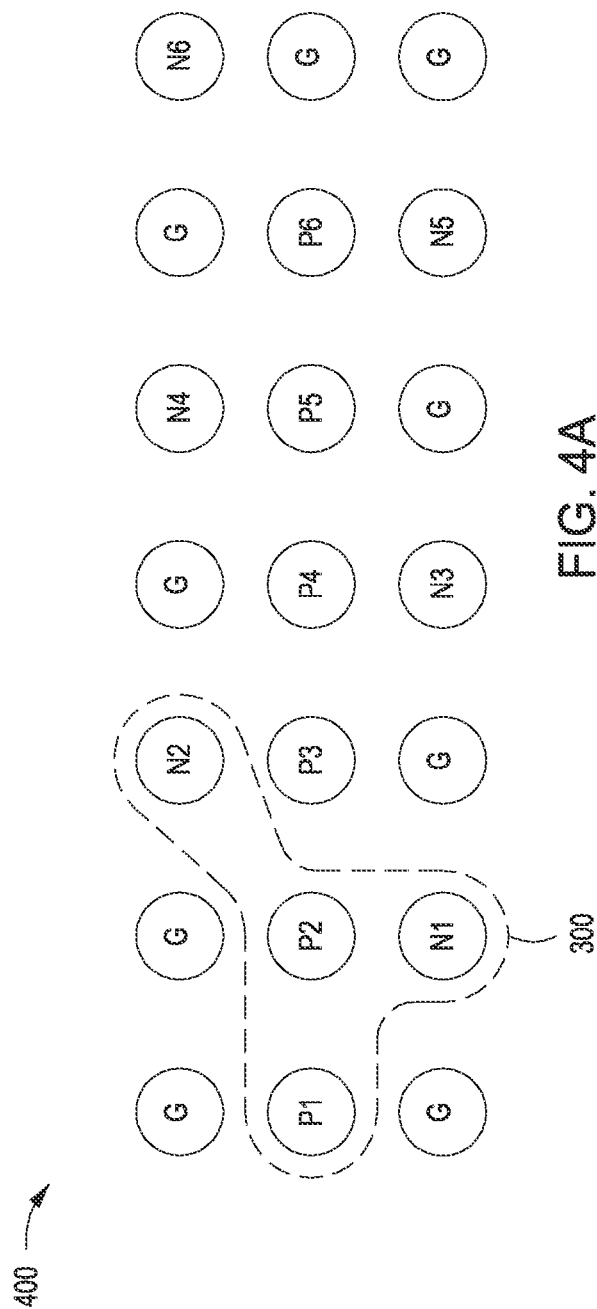
FIGS. 4A-4B are conceptual diagrams illustrating the PTH via patterns shown in FIG. 3A tiled across a two-dimensional plane, according to one embodiment of the present invention.
Figure 4B:
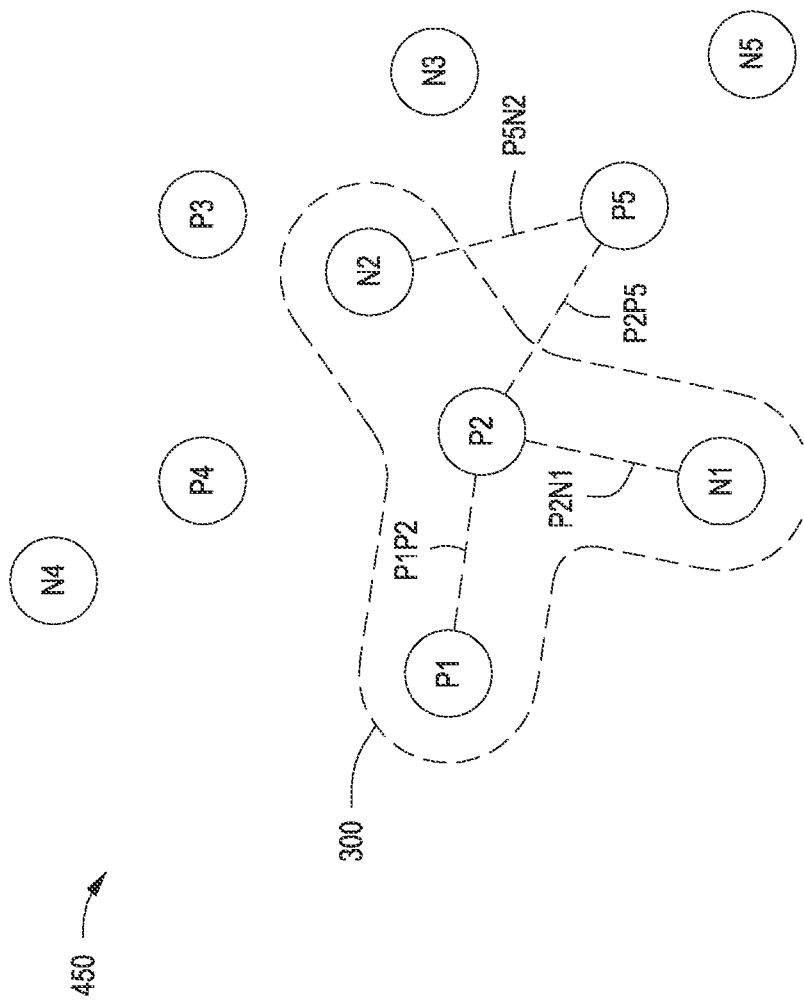

Referring generally to FIGS. 3A-3B, the different via patterns 300 and 350 may be tiled across a 2D plane in order to allow any number of differential signal pairs to be placed adjacent to one another without inducing unacceptable crosstalk. Such tilings can be implemented to construct package 130 with densely packed differential signal pairs. FIGS. 4A-4B set forth exemplary tilings of via pattern 300.

FIGS. 4A-4B are conceptual diagrams illustrating the substrate via pattern shown in FIG. 3A tiled across a two-dimensional plane, according to one embodiment of the present invention.

As shown in FIG. 4A, a tiling 400 includes an instance of via pattern 300, as well as plurality of ground vias labeled G. Tiling 400 may include many such instances of via pattern 300 beyond that which includes P1, P2, N1, and N2. For example, conductive elements P2, P3, N2, and N3 form another instance of via pattern 300. Further, conductive elements P3, P4, N3, and N4 form yet another instance of via pattern 300. With this approach, a plurality of vias can be arranged according to the general placement of vias in via pattern 300, thereby reducing crosstalk between differential signal pairs in that plurality.

As shown in FIG. 4B, a tiling 450 includes an instance of via pattern 300 that includes conductive elements labeled P1, P2, N1, and N2. Ground vias have been omitted for clarity. Tiling 450 may include many such instances of via pattern 300 beyond that which includes P1, P2, N1, and N2. For example, conductive elements P2, P3, N2, and N3 form another instance of via pattern 300. Further, conductive elements P2, P5, N2, and N5 form yet another instance of via pattern 300. In the arrangement shown, distance P1P2 is substantially equal to distance N1P2, as also described in conjunction with FIG. 3A. In addition, the distances P2P5 and N2P5 are also substantially equal. Further, the distances P1P2, N1P2, P2P5, and N2P5 may be substantially equal to one another. With this approach, a plurality of vias can be arranged according to the general placement of vias in via pattern 300, thereby reducing crosstalk between differential signal pairs in that plurality.

Referring generally to FIG. 4A-4B, the different tilings shown may be implemented with via pattern 300, in the fashion described, or with via pattern 350. Those tilings may be implemented to fabricate package 130, and may also be used to arrange balls 142 within BGA 140. Thus, balls 142 and PTH vias 132 may be arranged according to similar patterns. However, in order to maintain compatibility with conventional BGAs 140, package 130 may be subjected to redistribution techniques. In this manner, conductive elements coupled to balls 142 residing with conventional placements can be redistributed to occupy placements that adhere to patterns 300 or 350 and tilings 400 or 450. FIGS. 5A-5B set forth exemplary redistributions of PTH vias 132.

FIGS. 5A-5B are conceptual diagrams illustrating the via patterns shown in FIGS. 3A-3B, respectively, implemented with a conventional ball grid array.

As shown in FIG. 5A, BGA 140 includes a plurality of ground balls labeled G and signal balls labeled S. The ground balls G and signal balls S are distributed according to a conventional grid-type pattern. Conductive elements P1, P2, N1, and N are distributed according to PTH via pattern 300 shown in FIG. 3A. In order to electrically couple signal balls S to PTH vias P1, P2, N1, and N2, redistribution layer 134, shown in FIG. 1, is configured to provide various redistribution pathways that couple each signal ball S to a different conductive element within a PTH via 132. The formation of redistribution layer 134 may be accomplished through any technically feasible approach to fabrication.

As shown in FIG. 5B, BGA 140 includes a plurality of ground balls labeled G and signal balls labeled S. The ground balls G and signal balls S are distributed according to a conventional grid-type pattern. Conductive elements P1, P2, N1, and N are distributed according to PTH via pattern 350 shown in FIG. 3B. In order to electrically couple signal balls S to PTH vias P1, P2, N1, and N2, redistribution layer 134, shown in FIG. 1, is configured to provide various redistribution pathways that couple each signal ball S to a different conductive element within a PTH via 132. The formation of redistribution layer 134 may be accomplished through any technically feasible approach to fabrication.

Referring generally to FIGS. 5A-5B, the redistribution techniques described in conjunction with these figures allow the via patterns 300 and 350 to be implemented with a conventional BGA. Accordingly, manufacturers of IC system 100 may implement the techniques described herein to reduce crosstalk, without the need for changing the BGA layout.

Figure 6:
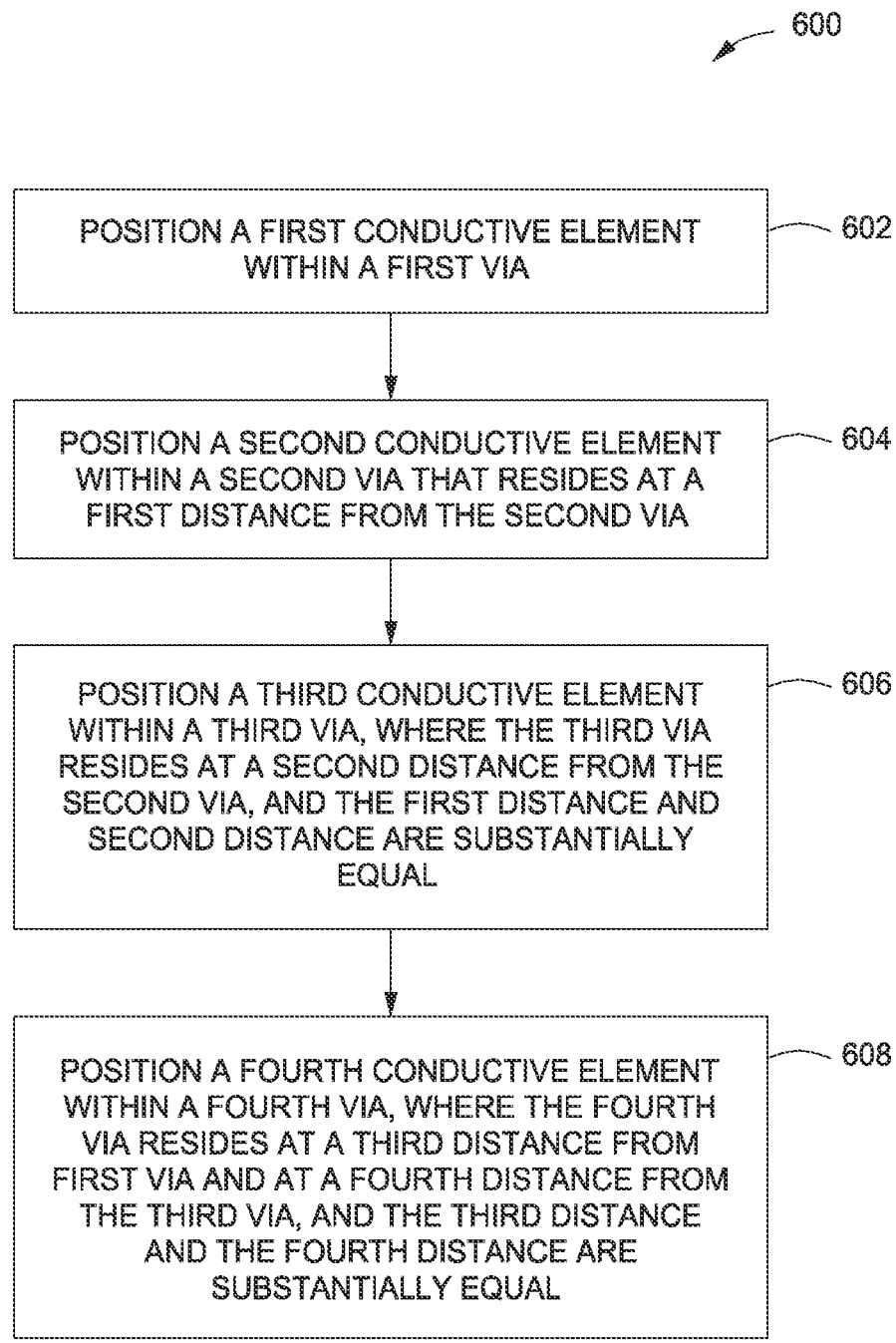
FIG. 6 is a flow diagram of method steps for manufacturing a package in an IC system, according to one embodiment of the present invention.

FIG. 6 is a flow diagram of method steps for manufacturing a package in an IC system, according to one embodiment of the present invention. Although the method steps are described in conjunction with the systems of FIGS. 1-5B, persons skilled in the art will understand that any system configured to perform the method steps, in any order, is within the scope of the present invention.

As shown, a method begins at step 602, where a first conductive element is placed within a first via. At step 604, a second conductive element is placed within a second via, where the first via resides at a first distance from the second via. At step 606, a third conductive element is placed within a third via, where the third via resides at a second distance from the second via, and the first distance and second distance are substantially equal. At step 608, a fourth conductive element is placed within a fourth via, where the fourth via resides at a third distance from the first via and at a fourth distance from the third via, and where the third distance and the fourth distance are substantially equal.

Persons skilled in the art will understand that the placement of conductive elements within vias may be accomplished through any technically feasible manufacturing technique (or combination of techniques) capable of fabricating PTH vias and placing conductive elements therein.

The various vias described above in conjunction with the method 600 may be any of PTH vias 132. In addition, the placement of those vias, and corresponding conductive elements, generally reflects either PTH via pattern 300 or PTH via pattern 350. By implementing the method 600 repeatedly, the PTH via pattern achieved by the method 600 may be replicated across a plane, in like fashion as described in conjunction with FIGS. 4A-4B. In addition, the method 600 may be applicable to embodiments where balls 142 within BGA 140 assume a crosstalk-reducing pattern, as described above in conjunction with FIG. 1. The method 600 may also be applicable to embodiments where balls 142 are distributed according to a conventional pattern, and redistribution layer 134 is implemented to allow PTH vias 132 to assume the crosstalk reducing pattern, as described above in conjunction with FIGS. 1 and 5A-5B.

Those having ordinary skill in the art will understand that the techniques described herein may be implemented to place vias within any technically feasible type of layer that may be associated with an integrated circuit, beyond the package layer discussed above. For example, PTH via pattern 300 may be implemented when placing printed circuit board (PCB) vias within a PCB layer. Further, the redistribution techniques described above in conjunction with FIGS. 5A-5B may also be implemented in the context of other aspects of semiconductor fabrication, such as PCB fabrication. For example, a PCB via pattern that reflects one of the PTH via patterns discussed above may provide electrical coupling with a BGA. The PCB could include a redistribution layer, analogous to redistribution layer 134 shown in FIG. 1, disposed on a top surface of the PCB. As a general matter, the techniques disclosed herein may be applicable to any type of semiconductor layer, integrated circuit element, communication link, and so forth, which may experience crosstalk.

In sum, an integrated circuit (IC) system includes an IC coupled to an IC package. The IC package, in turn, is coupled to a ball grid array. The IC is electrically coupled to the ball grid array by a plurality of substrate vias that penetrate through the substrate. Each substrate via includes a conductive element associated with a differential signaling pair. The conductive elements within a given differential signaling pair are disposed in the substrate at specific locations, relative to other conductive elements in other differential signaling pairs, to reduce crosstalk between those differential signal pairs.

At least one advantage of technique described herein is that the conductive elements within the package can be densely packed together without inducing excessive crosstalk. Therefore, the package can support a large number of differential signaling pairs, allowing high-throughput data communication.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

While the preceding is directed to embodiments of the present disclosure, other and further embodiments of the disclosure may be devised without departing from the basic scope thereof, and the scope thereof is determined by the claims that follow.

The invention claimed is:

1. An integrated circuit layer, comprising:
a first conductive element included within a first via, wherein:
the first via is aligned according to a first placement pattern and is coupled, through a redistribution layer, to a first ball included in a ball grid array that is aligned according to a second placement pattern, and
the orientation of differential pairs in the first placement pattern is different than the orientation of differential pairs in the second placement pattern;
a second conductive element included within a second via, wherein the first via resides at a first distance from the second via;
a third conductive element included within a third via, wherein the third via resides at a second distance from the second via, and the first distance and second distance are substantially equal; and
a fourth conductive element included within a fourth via, wherein the fourth via resides at a third distance from the first via and at a fourth distance from the third via, and wherein the third distance and the fourth distance are substantially equal.

2. The integrated circuit layer of claim 1, wherein the third distance and the fourth distance are greater than the first distance and the second distance.

3. The integrated circuit layer of claim 1, wherein the first conductive element and the third conductive element comprise a first differential signal pair, and the second conductive element and the fourth conductive element comprise a second differential signal pair.

4. The integrated circuit layer of claim 1, wherein the first conductive element and the fourth conductive element comprise a first differential signal pair, and the second conductive element and the third conductive element comprise a second differential signal pair.

5. The integrated circuit layer of claim 1, further comprising:
- a fifth conductive element included within a fifth via, wherein the fifth via resides at a fifth distance from the from the third via, and the fifth via resides at a sixth distance from the fourth via, and the fifth distance and the sixth distance are substantially equal;
- a sixth conductive element included within a sixth via, wherein the sixth via resides at a seventh distance from the third via, the sixth via resides at an eighth distance from the fourth via, and the seventh distance and the eighth distance are substantially equal.

6. The integrated circuit layer of claim 5, wherein the first distance, the second distance, the fifth distance, and the sixth distance are substantially equal, and the third distance, the fourth distance, the seventh distance, and the eighth distance are substantially equal.

7. The integrated circuit layer of claim 5, wherein the first distance, the second distance, the fifth distance, and the sixth distance are less than the third distance, the fourth distance, the seventh distance, and the eighth distance.

8. The integrated circuit layer of claim 1, wherein the first conductive element, the second conductive element, the third conductive element, and the fourth conductive element are coupled to the first ball, a second ball, a third ball, and a fourth ball, respectively, included within the ball grid array.

9. The integrated circuit layer of claim 8, wherein the first ball, the second ball, the third ball, and the fourth ball reside at positions substantially aligned with the first via, the second via, the third via, and the fourth via, respectively.

10. The integrated circuit layer of claim 8, wherein the first ball, the second ball, the third ball, and the fourth ball reside at positions not aligned with the first via, the second via, the third via, and the fourth via, respectively, and wherein the first conductive element, the second conductive element, the third conductive element, and the fourth conductive element are redistributed, from the first ball, the second ball, the third ball, and the fourth ball, respectively, to reside at the first via, the second via, the third via, and the fourth via, respectively.

11. An integrated circuit system, comprising:
- an integrated circuit; and
- an integrated circuit package coupled to the integrated circuit and including:
  - a first conductive element included within a first via, wherein the first via is aligned according to a first placement pattern,
  - a second conductive element included within a second via, wherein the first via resides at a first distance from the second via,
  - a third conductive element included within a third via, wherein the third via resides at a second distance from the second via, and the first distance and second distance are substantially equal, and
  - a fourth conductive element included within a fourth via, wherein the fourth via resides at a third distance from the first via and at a fourth distance from the third via, and wherein the third distance and the fourth distance are substantially equal;
  - a ball grid array that is aligned according to a second placement pattern, wherein the orientation of differential pairs in the first placement pattern is different than the orientation of differential pairs in the second placement pattern; and
  - a redistribution layer that couples a first ball included in the ball grid array to the first via.

12. The integrated circuit system of claim 11, wherein the third distance and the fourth distance are greater than the first distance and the second distance.

13. The integrated circuit system of claim 11, wherein the first conductive element and the third conductive element comprise a first differential signal pair, and the second conductive element and the fourth conductive element comprise a second differential signal pair.

14. The integrated circuit system of claim 11, wherein the first conductive element and the fourth conductive element comprise a first differential signal pair, and the second conductive element and the third conductive element comprise a second differential signal pair.

15. The integrated circuit system of claim 11, wherein the integrated circuit package further includes:
- a fifth conductive element included within a fifth via, wherein the fifth via resides at a fifth distance from the from the third via, and the fifth via resides at a sixth distance from the fourth via, and the fifth distance and the sixth distance are substantially equal;
- a sixth conductive element included within a sixth via, wherein the sixth via resides at a seventh distance from the third via, the sixth via resides at an eighth distance from the fourth via, and the seventh distance and the eighth distance are substantially equal.

16. The integrated circuit system of claim 15, wherein the first distance, the second distance, the fifth distance, and the sixth distance are substantially equal, and the third distance, the fourth distance, the seventh distance, and the eighth distance are substantially equal.

17. The integrated circuit system of claim 15, wherein the first distance, the second distance, the fifth distance, and the sixth distance are less than the third distance, the fourth distance, the seventh distance, and the eighth distance.

18. The integrated circuit system of claim 11, wherein:
- the ball grid array is coupled to the integrated circuit package and includes a plurality of balls; and
- the first conductive element, the second conductive element, the third conductive element, and the fourth conductive element are coupled to the first ball, a second ball, a third ball, and a fourth ball, respectively, included in the plurality of balls.

19. The integrated circuit package of claim 18, wherein the first ball, the second ball, the third ball, and the fourth ball reside at positions substantially aligned with the first via, the second via, the third via, and the fourth via, respectively.

20. The integrated circuit package of claim 18, wherein the first ball, the second ball, the third ball, and the fourth ball reside at positions not aligned with the first via, the second via, the third via, and the fourth via, respectively, and wherein the first conductive element, the second conductive element, the third conductive element, and the fourth conductive element are redistributed, via the redistribution layer, from the first ball, the second ball, the third ball, and the fourth ball, respectively, to reside at the first via, the second via, the third via, and the fourth via, respectively.

21. A method for fabricating an integrated circuit package, the method comprising:
- placing a first conductive element within a first via, wherein:
  - the first via is aligned according to a first placement pattern and is coupled, through a redistribution layer, to a first ball included in a ball grid array that is aligned according to a second placement pattern, and
  - the orientation of differential pairs in the first placement pattern is different than the orientation of differential pairs in the second placement pattern;
- placing a second conductive element within a second via, wherein the first via resides at a first distance from the second via;
- placing a third conductive element within a third via, wherein the third via resides at a second distance from the second via, and the first distance and second distance are substantially equal; and
- placing a fourth conductive element within a fourth via, wherein the fourth via resides at a third distance from the first via and at a fourth distance from the third via, and wherein the third distance and the fourth distance are substantially equal.

22. The method of claim 21, wherein the third distance and the fourth distance are greater than the first distance and the second distance.

* * * * *